United States Patent [19]
Makino et al.

[11] Patent Number: 4,820,943
[45] Date of Patent: Apr. 11, 1989

[54] DELAY CIRCUIT OF A VARIABLE DELAY TIME

[75] Inventors: Takashi Makino, Tokyo; Shūji Asami, Yokohama, both of Japan

[73] Assignee: Kabushiki Kaisha Toshiba, Kawasaki, Japan

[21] Appl. No.: 23,611

[22] Filed: Mar. 9, 1987

[30] Foreign Application Priority Data

Mar. 27, 1986 [JP] Japan ................................. 61-69230

[51] Int. Cl.⁴ ..................... H03K 17/28; H03K 5/22; H03K 19/096; H03K 5/159
[52] U.S. Cl. ................................. 307/603; 307/606; 307/605; 307/594; 307/595; 307/452; 328/55
[58] Field of Search ............. 307/603, 606, 594, 595, 307/597, 590, 596, 600, 601, 602, 605, 480, 481, 450, 452, 279, 288, 272.2, 585; 328/55; 377/117, 121, 127

[56] References Cited

U.S. PATENT DOCUMENTS

| | | | |
|---|---|---|---|
| 3,989,955 | 11/1976 | Suzuki | 307/481 |
| 4,445,051 | 4/1984 | Elmasry | 307/450 |
| 4,464,587 | 8/1984 | Suzuki et al. | 307/279 |
| 4,532,439 | 7/1985 | Koike | 307/279 |
| 4,568,842 | 2/1986 | Koike | 307/279 |

FOREIGN PATENT DOCUMENTS 2239060 2/1975 France ............................... 307/481

OTHER PUBLICATIONS

Suzuki et al., "Clocked CMOS Calculator Circuitry," IEEE Journal of Solid-State Circuits, vol. SC-8, No. 6, pp. 462–469, Dec. 1973.

Primary Examiner—Stanley D. Miller
Assistant Examiner—Huy Kim Mai
Attorney, Agent, or Firm—Finnegan, Henderson, Farabow, Garrett & Dunner

[57] ABSTRACT

A delay circuit comprising a plurality of clocked inverters coupled cascade form. Each clocked inverter includes a plurality of MOS FETs. The circuit further comprises delay time-controlling MOS FETs connected in parallel to the MOS FETs of the clocked inverters, which are controlled by clock signals. When the delay time-controlling MOS FETs are turned on, the clocked inverters function as ordinary inverters. Conversely, when the delay time-controlling MOS FETs are turned off, the clocked inverters perform their own functions. Hence, one of two different delay times can be selected.

12 Claims, 7 Drawing Sheets

DELAY CIRCUIT OF A VARIABLE DELAY TIME

BACKGROUND OF THE INVENTION

The present invention relates to a delay circuit whose delay time can be controlled, and, more particularly to a delay circuit used as one component of a line memory for use in a digital video apparatus such as a digital TV, a high-definition TV or a digital VCR.

FIG. 1 shows a conventional delay circuit whose delay time can be controlled. Input signal Din is supplied to first signal-delaying section 11, which is controlled by clock signals $\phi$ and $\bar{\phi}$. The output signal of signal-delaying section 11, or the delayed input signals Din, is supplied to second signal-delaying section 12 which is also controlled by clock signals $\phi$ and $\bar{\phi}$. The outputs of signal-delaying sections 11 and 12 are input to multiplexer 13. One of these outputs is selected by delay control signal DS supplied to multiplexer 13. Multiplexer 13 outputs the selected output from section 11 or 12, as a delayed output Dout. Hence, output Dout is delayed by the delay time of signal-delaying section 11 when multiplexer 13 selects the output of section 11, and delayed by the sum of the delay times of sections 11 and 12 when multiplexer 13 selects the output of section 12.

Signal-delaying sections 11 and 12 can be made of, for example, a dynamic shift register, as is shown in FIG. 2. This dynamic shift register comprises two clocked inverters 14 and 15. Clocked inverter 14 is controlled by clock signal $\bar{\phi}$. The output of clocked inverter 14 is input to clocked inverter 15. Clocked inverter 15 is controlled by clock signal $\phi$.

Alternatively, signal-delaying sections 11 and 12 can be comprised of such a static shift register as is shown in FIG. 3. This static shift register comprises four clocked inverters 16, 17, 18 and 19, and two inverters 20 and 21. Clocked inverters 16 and 19 are controlled by clock signal $\bar{\phi}$. Clocked inverters 17 and 18 are controlled by clock signal $\phi$.

The shift register shown in either FIG. 2 or FIG. 3 provides delay time equal to the one-cycle period of clock signal $\phi$. Therefore, any desired number of circuits shown in FIG. 2, or any desired number of circuits shown in FIG. 3 can be connected in cascade and can thus be used as signal-delaying sections (like sections 11 and 12 of the circuit illustrated in FIG. 1), thereby to provide desired delay times.

The operation of the circuit shown in FIG. 1 will be explained with reference to the timing charts of FIGS. 4A and 4B. FIG. 4A shows how the circuit operates when signal-delaying section 11 comprises two shift registers of FIG. 2 or FIG. 3 to delay an input signal by the two-cycle period of clock signal $\phi$, and signal-delaying section 12 comprises one shift register of FIG. 2 or FIG. 3 to delay an input signal by the one-cycle period of clock signal $\phi$. As is shown in this figure, when delay control signal DS is at the low level, the output of signal-delaying section 12 is selected. In this case, multiplexer 13 outputs delayed output Dout, or input signal Din which has been delayed by the three-cycle period of clock signal $\phi$. Conversely, when delay control signal DS is at the high level, the output of signal-delaying section 11 is selected. In this case, multiplexer 13 outputs delayed output Dout, or input signal Din which has been delayed by the two-cycle period of clock signal $\phi$.

FIG. 4B shows how the circuit of FIG. 1 operates when signal-delaying section 11 is designed to delay an input signal by the four-cycle period of clock signal $\phi$, and signal-delaying section 12 is so designed as to delay an input signal by the two-cycle period of clock signal $\phi$. When delay control signal DS is at the low level, the output of signal-delaying section 12 is selected, and multiplexer 13 outputs delayed output Dout, or input signal Din which has been delayed by the six-cycle period of clock signal $\phi$. When delay control signal DS is at the high level, the output of signal-delaying section 11 is selected. In this case, multiplexer 13 outputs output signal Dout, or input signal Din which has been delayed by the four-cycle period of clock signal $\phi$.

FIG. 5 shows a delay control memory comprising three delay circuits 10-1, 10-2 and 10-3, all identical with the circuit of FIG. 1, one shift register 1, and n shift register, 2-1 to 2-n. Shift register 1 is used to synchronize input signal Din with a clock signal. Shift registers 2-1 to 2-n each store an input signal (Din) and then supply it to the next shift register. This memory has various delay times which are defined by various possible combinations of the two delay times of each delay circuit and one of which is selected in accordance with delay control signals DS1, DS2 and DS3.

Each of delay circuits 10-1 to 10-3, which constitute the delay control memory shown in FIG. 5, is provided with a multiplexer for selecting the output of one of the two signal-delaying sections forming the delay circuit. Each delay circuit, therefore, has many gates and many connecting wires. Since the delay control memory is comprised of some delay circuits of this type, which are connected in cascade, the memory will have a large chip size when it is manufactured in the form of an integrated circuit.

SUMMARY OF THE INVENTION

Accordingly, it is an object of the present invention to provide a delay circuit of a variable delay time, which comprises a small number of elements, requires but a small number of connecting wires, and, therefore, occupies only a small pattern area of an integrated circuit.

According to the present invention, there is provided a delay circuit which comprises a first clocked inverter including MOS FETs, some of which are controlled by first clock signals, a second clocked inverter including MOS FETs, some of which are controlled by second clock signals of phases opposite to those of the first clock signals, and a plurality of delay time-controlling MOS FETs connected in parallel to the MOS FETs of the first and second clocked inverters, which are controlled by the clock signals, and designed to be controlled by a delay control signal.

The delay circuit according to this invention need not be provided with multiplexers. Hence, it can be made of less elements and less connecting wires than the conventional delay circuit of the same function. It therefore occupies only a small pattern area.

DETAILED DESCRIPTION OF THE PREFERRED EMBODIMENTS

Figure 1:
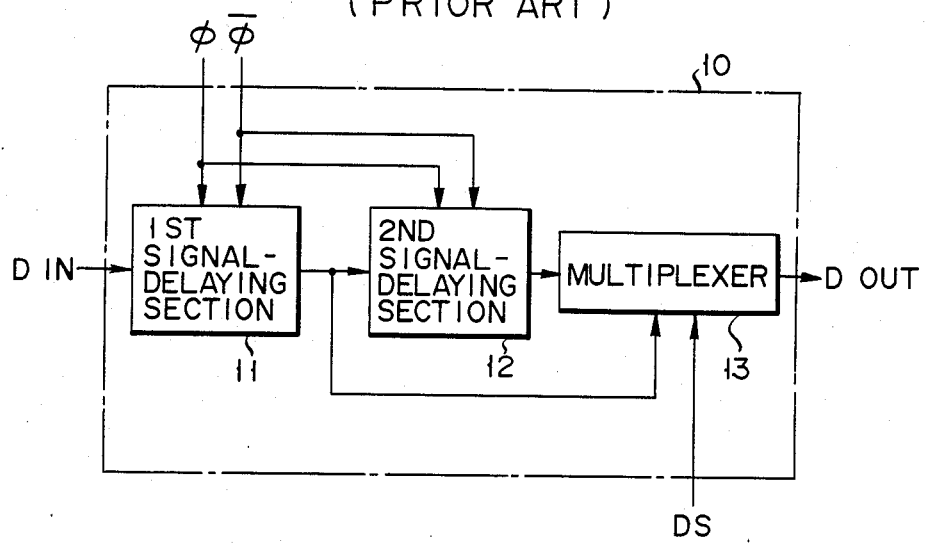
FIG. 1 is a diagram showing a conventional delay circuit whose delay time can be controlled.
Figure 2:
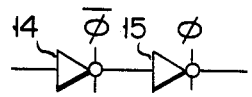
FIG. 2 is a circuit diagram of a signal-delaying section which can be used in the circuit shown in FIG. 1.
Figure 3:
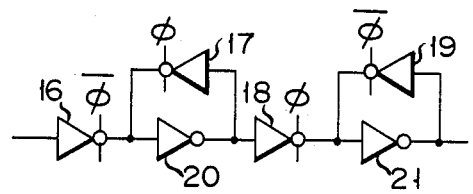
FIG. 3 is a circuit diagram of another signal-delaying section which can be used in the circuit shown in FIG. 1.
Figure 4:
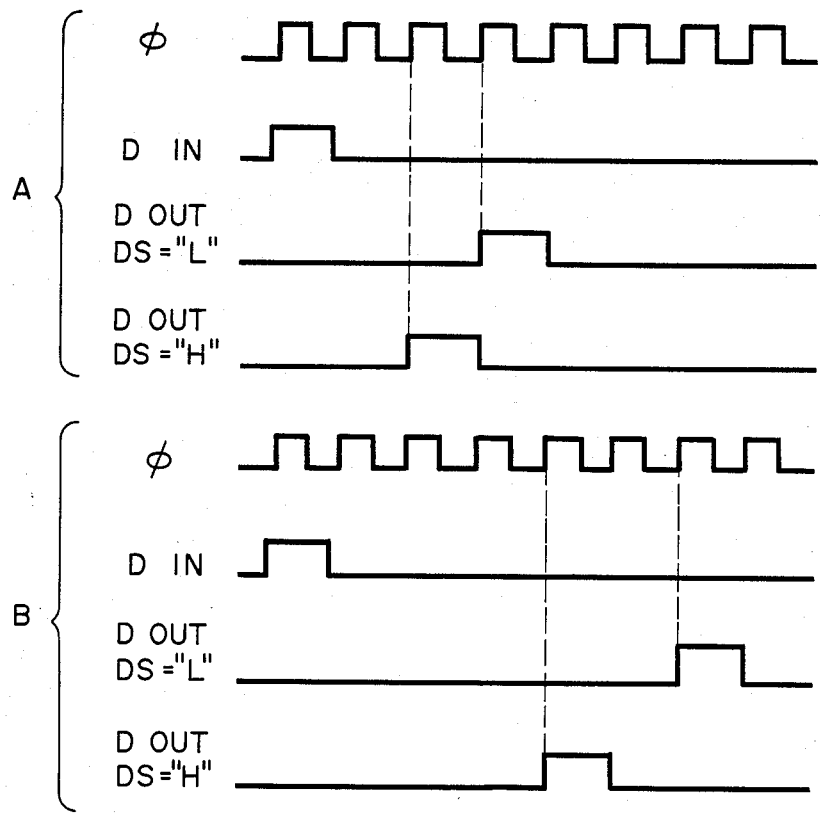
FIGS. 4A and 4B are timing charts explaining the operation of the delay circuit shown in FIG. 1.
Figure 5:
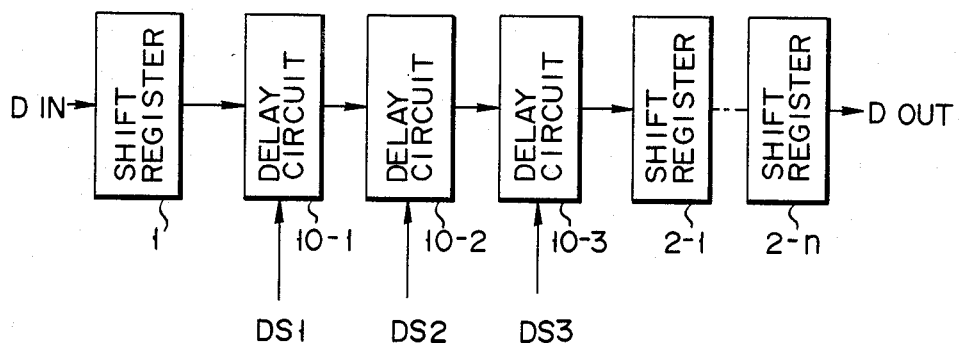
FIG. 5 is a block diagram showing a delay control memory comprising a plurality of delay circuits identical with the circuit of FIG. 1.
Figure 6:
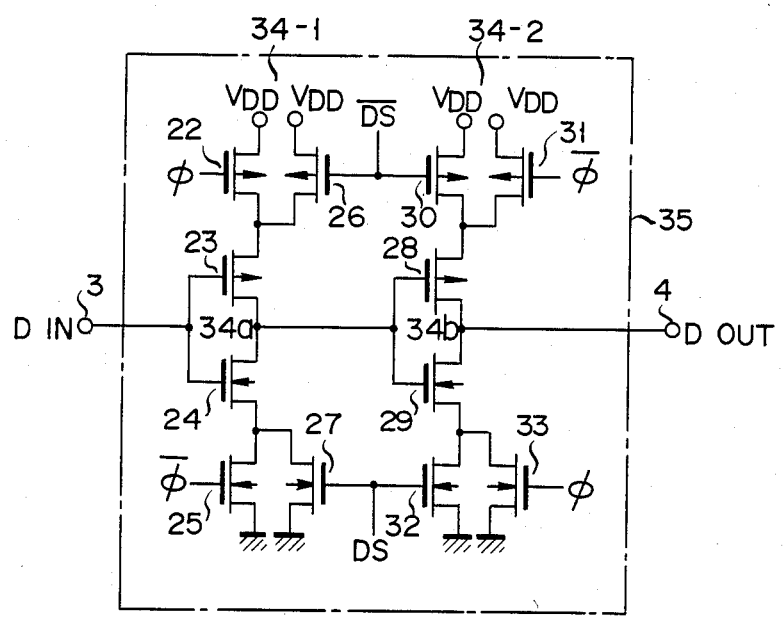
FIG. 6 is a diagram showing a delay circuit according to the present invention, whose delay time can be controlled.

FIG. 6 shows a delay circuit according to the invention, whose delay time can be controlled. The circuit of this figure is essentially a dynamic shift register. P-channel MOS FETs 22 and 23, and N-channel MOS FETs 24 and 25 are connected in series, thus forming a series circuit coupled between power supply $V_{DD}$ and the ground. Input terminal 3, to which input signal Din is supplied, is coupled to the gates of MOS FETs 23 and 24. A clock signal $\phi$ is supplied to the gate of MOS FET 22, and a clock signal $\bar{\phi}$ is supplied to the gate of MOS FET 25. P-channel MOS FET 26, which is controlled by a delay control signal $\overline{DS}$, is coupled between power supply $V_{DD}$ and the connection point of MOS FETs 22 and 23. N-channel MOS FET 27, which is controlled by a delay control signal DS, is coupled between the ground and the connection point of MOS FETs 24 and 25. The gate of P-channel MOS FET 28 is connected to the connection point of MOS FETs 23 and 24. Further, the gate of N-channel MOS FET 29 is coupled to the same connection point. These MOS FETs 28 and 29 are connected at one end to each other. MOS FET 30, which is controlled by delay control signal $\overline{DS}$, and MOS FET 31, which is controlled by clock signal $\bar{\phi}$, are connected in parallel, thereby forming a parallel circuit coupled between the other end of MOS FET 28 and power supply $V_{DD}$. Similarly, MOS FET 32, which is controlled by delay control signal DS, and MOS FET 33, which is controlled by clock signal $\phi$, are coupled in parallel, thus forming a parallel circuit connected between the other end of MOS FET 29 and the ground. Output terminal 4 is coupled to the connecting point of MOS FETs 28 and 29. A delayed output Dout is supplied from output terminal 4.

The operation of the delay circuit shown in FIG. 6 will be explained. When delay control signal DS is set at the low level, and delay control signal $\overline{DS}$ is set to the high level, MOS FETs 26, 27, 30 and 32, which are provided to control the delay time of the circuit, are turned off. Then, the circuit functions as a dynamic shift register which comprises two clocked inverters 34-1 and 34-2, coupled in cascade. In this case, inverter 34-1 operates in synchronism with clock signal $\bar{\phi}$, and inverter 34-2 operates in synchronism with clock signal $\phi$. Conversely, when delay control signal DS is set at the high level, and delay control signal $\overline{DS}$ is set at the low level, MOS FETs 26, 27, 30 and 32 are turned on. As a result, the circuit of FIG. 6 functions as a delay circuit comprised of two CMOS inverters 34a and 34b, the former consisting of MOS FETs 23 and 24, and the latter consisting of MOS FETs 28 and 29. In this case, clock signals $\phi$ and $\bar{\phi}$ do not operate any element of the circuit, and the delay time of the circuit is defined by the two CMOS inverters and is, thus, short.

Figure 7A:
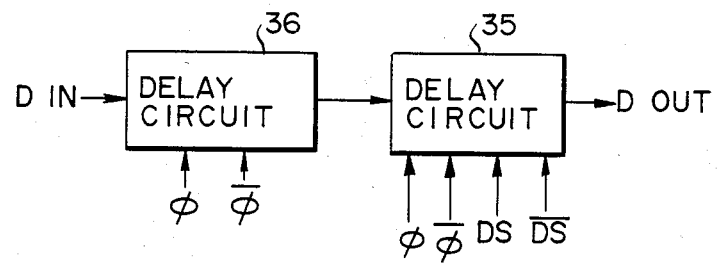
FIGS. 7A to 7C are diagrams showing other delay circuits according to the present invention.

FIG. 7A is a block diagram of a delay circuit whose delay time can be controlled. This circuit comprises delay circuit 35 of the same type as shown in FIG. 6, and ordinary delay circuit 36 connected to the input of circuit 35. The delay time of circuit 36 cannot be controlled. When delay control signal DS is at the low level, clocked inverters 34-1 and 34-2 of delay circuit 35 operate, and delay circuits 35 and 36 cooperate to provide delayed output Dout. On the other hand, when delay control signal DS is at the high level, clocked inverters 34-1 and 34-2 function as ordinary inverters. Therefore, delayed output Dout is the output of ordinary delay circuit 36, provided that the delay times of CMOS inverters 34a and 34b forming delay circuit 35 are negligibly short.

The delay circuit shown in FIG. 7A can perform its function without any multiplexer. Hence, it need not be provided with elements for constituting a multiplexer, or wires for connecting such elements. The delay circuit, therefore, requires only a small pattern area.

Figure 7B:
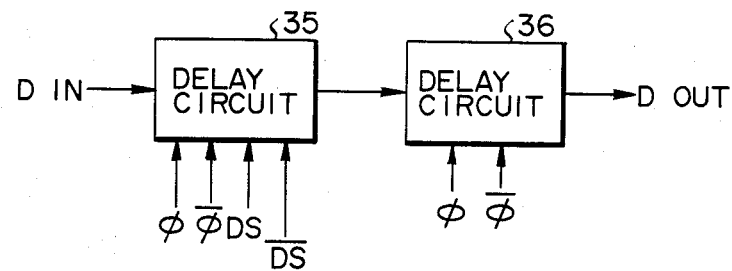

FIG. 7B shows another delay circuit comprising delay circuit 35 of the same type as illustrated in FIG. 6, and ordinary delay circuit 36 coupled to the output of delay circuit 35. This circuit performs the same function as the delay circuit shown in FIG. 7A, and does not require any multiplexer. Hence it need not have elements for forming a multiplexer, or wires for connecting such elements. The delay circuit of FIG. 7B also needs only a small pattern area.

Figure 7C:
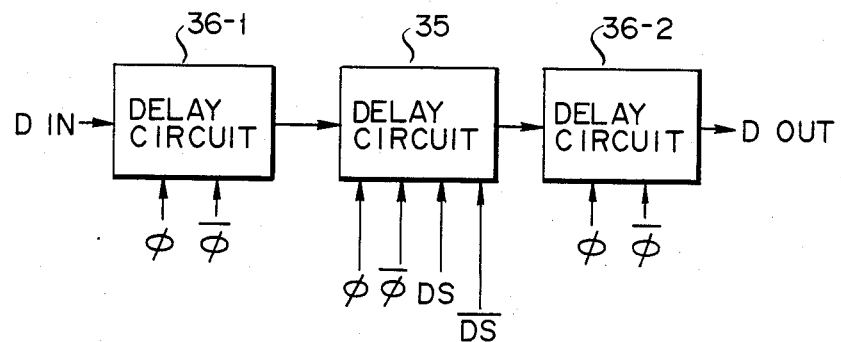

FIG. 7C shows still another delay circuit. This circuit comprises delay circuit 35 of the same type as shown in FIG. 6, ordinary delay circuit 36-1 coupled to the input of circuit 35, and another ordinary delay circuit 36-2 connected to the output of circuit 35. When delay control signal DS is at the low level, the circuit delays input signal Din by the sum of the delay times of circuits 36-1, 35 and 36-2. That is, the output signal Dout of this circuit is delayed by the sum of said delay times, with respect to input signal Din. On the other hand, when delay control signal DS is at the high level, the circuit produces output signal Dout which is delayed by the sum of the delay times of circuits 36-1 and 36-2, with respect to input signal Din.

Figure 8:
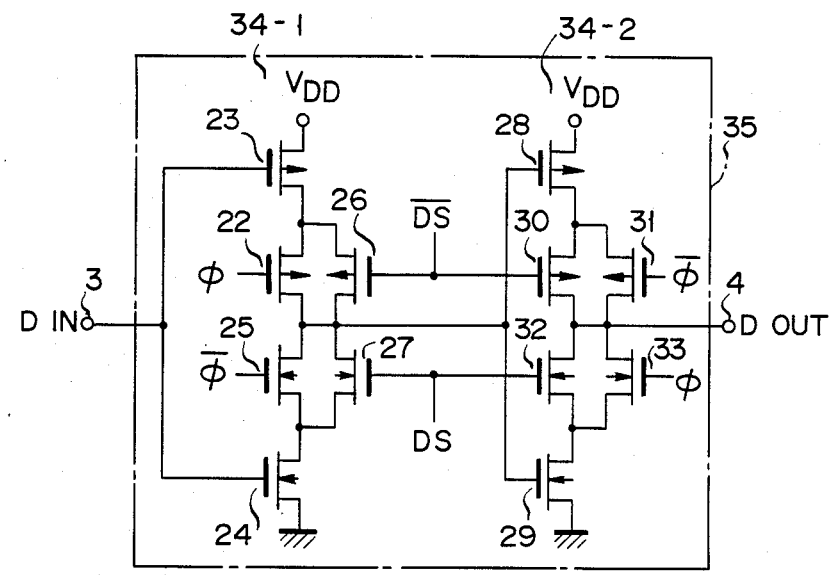
FIGS. 8 and 9 are diagrams showing still other delay circuits according to the present invention.

The delay circuit shown in FIG. 6 comprises two clocked inverters 34-1 and 34-2. MOS FETs 22 and 31, which are controlled by clock signals $\phi$ and $\bar{\phi}$ respectively, are connected to power supply $V_{DD}$. MOS FETs 25 and 33, which are controlled by clock signals $\bar{\phi}$ and $\phi$, respectively, are grounded. Alternatively, MOS FETs 22, 25, 31 nd 33 can be provided at the outputs of the clocked inverters, as is illustrated in FIG. 8. In the delay circuit of FIG. 8, wherein the same numerals are used to denote the same MOS FETs as those shown in FIG. 6, P-channel MOS FETs 23 and 22 and N-channel MOS FETs 25 and 24 and connected in series between power supply $V_{DD}$ and the ground. Input terminal 3 is coupled to the gates of MOS FETs 23 and 24, and input signal Din is supplied to the gates of these MOS FETs. Clock signal $\phi$ is supplied to the gate of MOS FET 22, and clock signal $\bar{\phi}$ is supplied to the gate of MOS FET 25. P-channel MOS FET 26 is connected between the connection point of MOS FETs 22 and 23 and the connection point of MOS FETs 22 and 25. N-channel MOS FET 27 is coupled between the connection point of MOS FETs 24 and 25 and the connection point of MOS FETs 22 and 25. MOS FET 26 is controlled by delay control signal $\overline{DS}$, and MOS FET 27 is controlled by delay control signal DS. The gate of P-channel MOS FET 28, and the gate of N-channel MOS FET 29 are connected to the connection point of MOS FETs 22 and 5 and 25. Power supply $V_{DD}$ is coupled to one end of MOS FET 28. One end of MOS FET 29 is connected to the ground. P-channel MOS FET 31 and N-channel MOS FET 33 are connected in series between the other end of MOS FET 28 and the other end of MOS FET 29. MOS FETs 31 and 33 are controlled by clock signals $\bar{\phi}$ and $\phi$, respectively. Further, P-channel MOS FET 30, which is controlled by delay control signal $\overline{DS}$, is connected between the other end of MOS FET 28 and the connection point of MOS FETs 31 and 33. N-channel MOS FET 32, which is controlled by delay control signal DS, is connected between the other end of MOS FET 29 and the connection point of MOS FETs 31 and 33. Output terminal 4 is connected to the connection point of MOS FETs 31 and 33, for supplying delay output Dout.

The delay circuit of FIG. 8 can perform the same function and achieve the same advantages as the delay circuit illustrated in FIG. 6.

Figure 9:
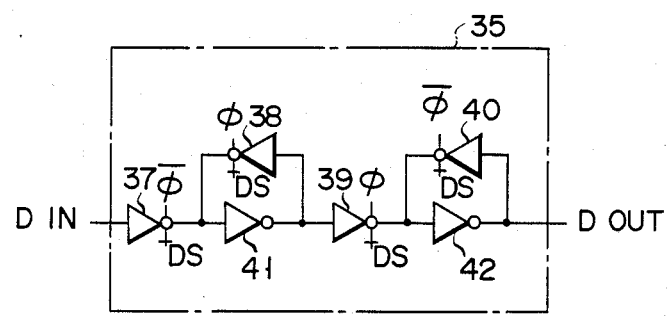

The embodiments described above are delay circuits comprising dynamic shift registers. The present invention is not limited to these embodiments. It can apply to a static delay circuit as is shown in FIG. 9. As is shown in FIG. 9, the static delay circuit comprises clocked inverters 37 to 40, and two CMOS inverters 41 and 42. Clocked inverters 37 to 40, which are represented by special symbols in FIG. 9, are of the same structure as clocked inverter 34-1 or 34-2, both being illustrated in FIGS. 6 or 8. That is, each of these clocked inverters includes MOS FETs controlled by clock signals $\phi$ and $\bar{\phi}$, and delay time-controlling MOS FETs connected in parallel to the clock-controlled MOS FETs and controlled by delay control signals DS and $\overline{DS}$. Clocked inverter 37, 38 and CMOS inverter 41 form a latch circuit. Similarly, clocked inverter 39, 40 and CMOS inverter 42 constitute a latch circuit. Either latch circuit statically transfers input signal Din.

The static delay circuit of FIG. 9 operates in the same way as the dynamic shift register described above. That is, the circuit can delay input signal Din by one-cycle period of clock signal $\phi$, or by a shorter period. In the latter case, clocked inverters 37 to 40 function as CMOS inverters, and input signal Din is output through inverters 37, 41, 39, and 42. Clocked inverters 38 and 40 need not be identical with clocked inverter 34-1 or 34-2 (FIG. 8); they can be of the ordinary structure known in the art.

Figure 10:
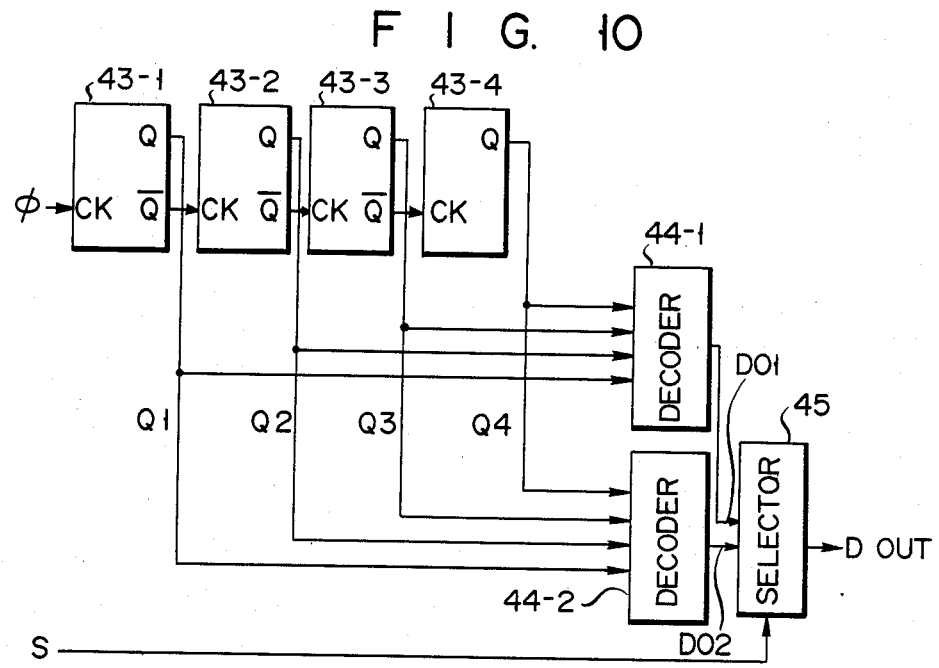
FIG. 10 is a block diagram of a counter data-decoding section of the known type.

FIG. 10 shows a counter data-decoding section of the known type. As is shown in FIG. 10, clock signal $\phi$ is supplied to clock input terminal CK of binary counter 43-1. Output terminal $\bar{Q}$ of counter 43-1 is connected to clock input terminal CK of another binary counter 43-2. Output terminal Q of counter 43-1 is connected to the inputs of decoders 44-1 and 44-2. Output terminal $\bar{Q}$ of counter 43-2 is coupled to clock input terminal CK of binary counter 43-3. Output terminal Q of counter 43-2 is connected to other inputs of decoders 44-1 and 44-2.

Similarly, counter 43-3 has its output terminal $\bar{Q}$ coupled to the clock input terminal CK of binary counter 43-4, and its output terminal Q connected to other inputs of decoders 44-1 and 44-2. Further, counter 43-4 has its output terminal Q coupled to other inputs of decoders 44-1 and 44-2. The outputs of decoders 44-1 and 44-2 are connected to the inputs of selector 45. Selector 45 selects the output of decoder 44-1 or that of decoder 44-2, in accordance with selection signal S.

Figure 11:
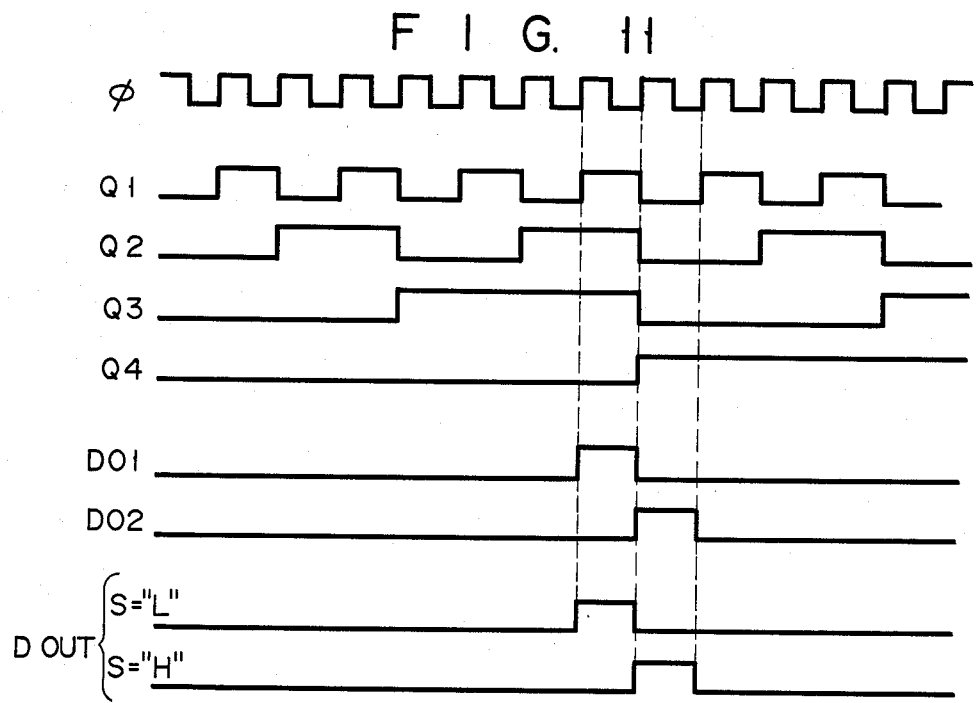
FIG. 11 is a timing chart illustrating the operation of the circuit shown in FIG. 10.

The circuit of FIG. 10 operates as is shown by the timing chart of FIG. 11. Clock signal $\phi$ is frequency-divided by binary counter 43-1, then is further frequency-divided by binary counter 43-2, then is also frequency-divided by binary counter 43-3, and finally is further frequency-divided by binary counter 43-4. Hence, output signal Q1 of counter 43-1 has a one-cycle period twice as long as that of clock signal $\phi$; output signal Q2 of counter 43-2 has a one-cycle period four times longer than that of clock signal $\phi$; output signal Q3 of counter 43-3 has a one-cycle period eight times longer than that of clock signal $\phi$; and output signal Q4 of counter 43-4 has a one-cycle period 16 times longer than that of clock signal $\phi$. Output signals Q1-Q4 are decoded by decoder 44-1, and also by decoder 44-2. Output D01 of decoder 44-1 and output D02 of decoder 44-2 are input to selector 45. Selector 45 selects output D01 of decoder 44-1 when selection signal S is at the low level, and selects output D02 of decoder 44-2 when signal S is at the high level.

Figure 12:
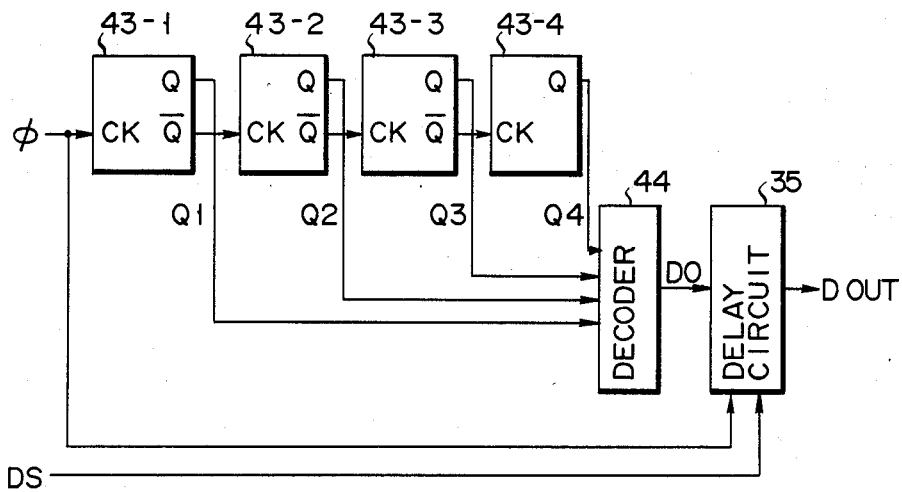
FIG. 12 is a block diagram of a counter data-decoding section including a delay circuit of the present invention.

The circuit of FIG. 10 requires two decoders 44-1 and 44-2. This is disadvantageous, in view of fabricating the circuit in the form of an integrated circuit. Only one decoder suffices if the delay circuit shown in FIG. 6 is used as is illustrated in FIG. 12. The circuit of FIG. 12 operates in the same way as the circuit of FIG. 10. This circuit comprises four binary counters 43-1, 43-2, 43-3 and 43-4, one decoder 44, and one delay circuit 35 of the same type as shown in FIG. 6. The outputs Q of the four binary counters are connected to the input of decoder 44. The output of this decoder is coupled to the input of delay circuit 35. Clock signal $\phi$ is supplied to delay circuit 35, and delay circuit 35 is controlled by delay control signal DS.

Figure 13:
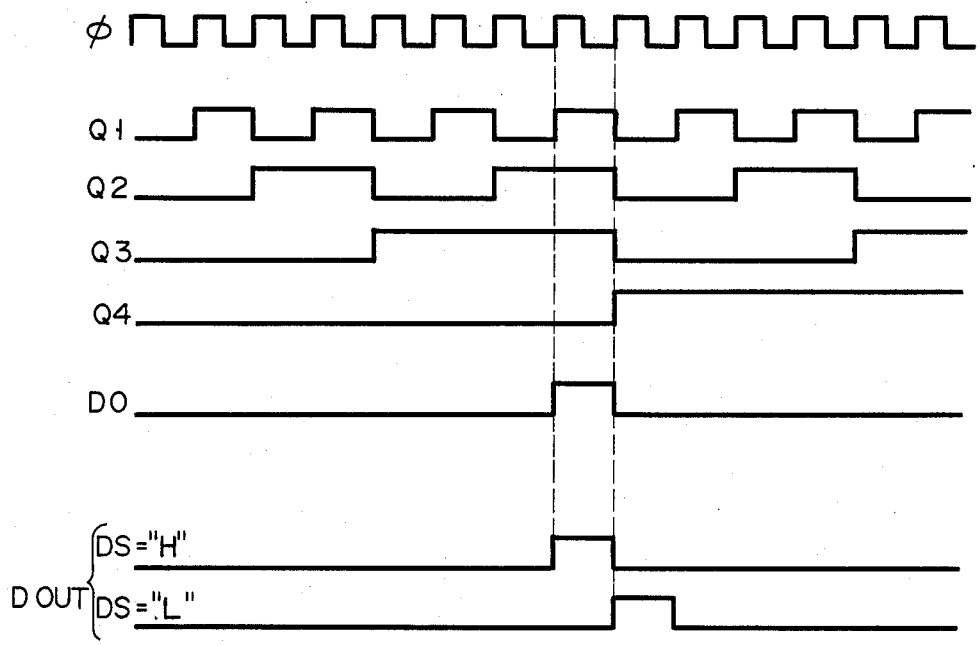
FIG. 13 is a timing chart explaining the operation of the circuit shown in FIG. 12.

The operation of the circuit shown in FIG. 12 will be described with reference to the timing chart of FIG. 13. When delay control signal DS is at the high level, the output D0 of decoder 44 is output through delay circuit 35, without being delayed. When delay control signal DS is at the low level, delay circuit 35 performs its function, thus delaying output DO by the one-cycle period of clock signal $\phi$. Therefore, the circuit of FIG. 12 can output the same signal Dout as the circuit of FIG. 10 does. Since the circuit of FIG. 12 requires only one decoder, it can easily be made into an integrated circuit.

Suppose the circuit of FIG. 10 is so designed that the output D02 of decoder 44-2 is delayed by the two-cycle period of clock signal $\phi$ with respect to the output D01 of decoder 44-1. To make the circuit of FIG. 12 provide an output Dout which is delayed also by the two-cycle period of clock signal $\phi$, it suffices to connect a delay circuit identical with circuit 35 between decoder 44 and circuit 35 or to the output of circuit 35, and to control this additional delay circuit by delay control signal DS. Then, the circuit of FIG. 12 outputs an output Dout delayed by the two-cycle period of clock signal $\phi$ when delay control signal DS is at the high level. Other additional delay circuits identical with circuit 35 can be used in the circuit of FIG. 12, in a similar manner, in order to provide outputs delayed by various periods.

Further, to make the circuit of FIG. 12 function in the same way as a conventional circuit which is identical with the circuit of FIG. 10, it suffices to incorporate two or more circuits 35 in the circuit of FIG. 12.

What is claimed is:

1. A delay circuit comprising:
a first clocked inverter including a plurality of first MOS FETs, said first MOS FETs being responsive to an input signal, and a plurality of second MOS FETs, said second MOS FETs being responsive to a pair of clock signals one of said pair being of a phase opposite to another of said pair;
a second clocked inverter, including a plurality of third MOS FETs, said third MOS FETs being responsive to an output of said first clocked inverter, and a plurality of fourth MOS FETs, said fourth MOS FETs being responsive to said clock signals, said second clocked inverter complementarily operating with said first clocked inverter; and
a plurality of delay time-controlling MOS FETs each being connected in parallel to one of said second and, fourth MOS FETs, respectively, said delay time-controlling MOS FETs being controlled by a pair of delay control signals, one of said pair being a phase opposite to another of said pair.

2. A delay circuit according to claim 1, wherein said delay time-controlling MOS FETs each are of the same conductivity type as the respective one of said second and fourth MOS FETs to which said delay time-controlling MOS FETs are connected in parallel.

3. A delay circuit according to claim 1, further comprising signal-delaying means connected to the input terminal of said first clocked inverter wherein a delay time generated by said signal-delaying means is selected to be output by said delay circuit if the phase of said delay control signal is at one level and the sum of said delay time generated by said signal-delaying means and the delay time generated by said first and second clocked inverters is selected to be output by said delay circuit if the phase of said delay control signal is at another level.

4. A delay circuit according to claim 1, further comprising signal-delay means, connected to the output terminal of said second clocked inverter, wherein a delay time generated by said signal-delaying means is selected to be output by said delay circuit if the phase of said delay control signal is at one level and the sum of said delay time generated by said signal-delaying means and the delay time generated by said first and second clocked inverters is selected to be output by said delay circuit if the phase of said delay control signal is at another level.

5. A delay circuit according to claim 1, further comprising first and second signal-delaying means, connected to the input terminal of said first clocked inverter and the output terminal of said second clocked inverter, respectively, wherein the sum of the delay time generated by said first and second signal-delaying means is selected to be output by said delay circuit if the phase of said delay control signal is at one level and the sum of said delay time generated by said first and second signal-delaying means and the delay time generated by said first and second clocked inverters is selected to be output by said delay circuit if the phase of said delay control signals is at another level.

6. A delay circuit comprising:
an input terminal for receiving an input signal;
a first MOS FET of a first conductivity type, having a gate, a drain and a source, said gate being connected to said input terminal;
a second MOS FET of a second conductivity type, having a gate, a drain and a source, said gate being connected to said input terminal, and wherein said second MOS FET is connected at one end to one end of said first MOS FET;
a first potential source;
a third MOS FET of the first conductivity type connected between another end of said first MOS FET and said first potential source, and being controlled by a first clock signal;
a second potential source;
a fourth MOS FET of the second conductivity type connected between another end of said second MOS FET and said second potential source, and being controlled by a second clock signal obtained by inverting said first clock signal;
a fifth MOS FET of the first conductivity type connected between said first potential source and the connection point of said first and third MOS FETs, and being controlled by a first delay control signal;
a sixth MOS FET of the second conductivity type connected between said second potential source and the connection point of said second and fourth MOS FETs, and being controlled by a second delay control signal obtained by inverting said first delay control signal;
a seventh MOS FET of the first conductivity type, having a gate, a drain and a source, said gate being connected to the connection point of said first and second MOS FETs;
an eighth MOS FET of the second conductivity type, having a gate, a drain and a source, said gate being connected to the connection point of said first and second MOS FETs, and wherein said eighth MOS FET is connected at one end to one end of said seventh MOS FET;
a ninth MOS FET of the first conductivity type, connected between said first potential source and another end of said seventh MOS FET, and being controlled by said second clock signal;
a tenth MOS FET of the second conductivity type, connected between said second potential source and another end of said eighth MOS FET, and being controlled by said first clock signal;
an eleventh MOS FET of the first conductivity type, connected between said first potential source and the connection point of said seventh and ninth MOS FETs, and being controlled by said first delay control signal;
a twelfth MOS FET of the second conductivity type, connected between said second potential source and the connection point of said eighth and tenth MOS FETs, and being controlled by said second delay control signal; and
an output terminal connected to the connection point of said seventh and eighth MOS FETs.

7. A delay circuit comprising:
an input terminal for receiving an input signal;
a first potential source;
a first MOS FET of a first conductivity type, having a gate, a drain and a source, said gate being connected to said input terminal, and said first MOS FET being connected at one end to said first potential source;

a second potential source;

a second MOS FET of a second conductivity type, having a gate, a drain and a source, said gate being connected to said input terminal, and said second MOS FET being connected at one end to said second potential source;

a third MOS FET of the first conductivity type, connected at one end to another end of said first MOS FET, and being controlled by a first clock signal;

a fourth MOS FET of the second conductivity type, connected between another end of said third MOS FET and another end of said second MOS FET, and being controlled by a second clock signal obtained by inverting said first clock signal;

a fifth MOS FET of the first conductivity type, connected between the connection point of said first and third MOS FETs and the connection point of said third and fourth MOS FETs, and being controlled by a first delay control signal;

a sixth MOS FET of the second conductivity type, connected between the connection point of said second and fourth MOS FETs and the connection point of said third and fourth MOS FETs, and being controlled by a second delay control signal obtained by inverting said first delay control signal;

a seventh MOS FET of the first conductivity type, having a gate, a drain and a source, connected at one end to said first potential source, and wherein said gate is connected to the connection point of said third and fourth MOS FETs;

an eighth MOS FET of the second conductivity type, having a gate, a drain and a source, connected at one end to said second potential source, and wherein said gate is connected to the connection point of said third and fourth MOS FETs;

a ninth MOS FET of the first conductivity type, connected at one end to another end of said seventh MOS FET, and being controlled by said second clock signal;

a tenth MOS FET of the second conductivity type, connected between another end of said ninth MOS FET and another end of said eighth MOS FET, and being controlled by said first clock signal;

an eleventh MOS FET of the first conductivity type, connected between the connection point of said seventh and ninth MOS FETs and the connection point of said ninth and tenth MOS FETs, and being controlled by said first delay control signal;

a twelfth MOS FET of the second conductivity type, connected between the connection point of said eighth and tenth MOS FETs and the connection point of said ninth and tenth MOS FETs, and being controlled by said second delay control signal; and an output terminal connected to the connection point of said ninth and tenth MOS FETs.

8. A delay circuit comprising:

a first inverter having an input for receiving an input signal and an output, the first clocked inverter including a first plurality of MOS FETs controlled by first clock signals;

a first inverter having an input and an output, the input being connected to the output of the first clocked inverter;

a second clocked inverter having an output connected to the input of the first converter and an input connected to the output of the first inverter, the second clocked inverter including a first plurality of MOS FETs controlled by second clock signals having a phase opposite to those of the first clock signals;

a third clocked inverter having an input connected to the output of the first inverter and an output, the third clocked inverter including a first plurality of MOS FETs controlled by the second clock signals;

a second inverter having an input and an output, the input being connected to the output of the third clocked inverter;

a fourth clocked inverter having an output connected to the input of the second inverter and an input connected to the output of the second inverter, the fourth clocked inverter including a first plurality of MOS FETs controlled by the first clock signals;

an output terminal connected to the output of the second inverter and the input of the fourth clocked inverter; and each of the first, second, third, and fourth clocked inverters including a second plurality of MOS FETs operatively connected to the corresponding first plurality of MOS FETs responsive to a delay control signal for eliminating the clocked delay in the respective first, second, third, and fourth clocked inverters.

9. A delay circuit according to claim 8, wherein each of the second plurality of MOS FETs is the same conductivity type as the corresponding first plurality of MOS FETs to which the second plurality of MOS FETs are operatively connected.

10. A delay circuit according to claim 8, further comprising signal-delaying means, connected to the input terminal of said first clocked inverter wherein a delay of time generated by said signal-delaying means is selected to be output by said delay circuit if the phase of said delay control signal is at one level and the sum of said delay time generated by said signal-delaying means and the delay time generated by said first to fourth clocked inverters and said first and second inverters is selected to be output by said delay circuit if the phase of said delay control signal is at another level.

11. A delay circuit according to claim 8, further comprising signal-delaying means, connected to the output terminal of said second inverter, wherein a delay time generated by said signal-delaying means is selected to be output by said delay circuit if the phase of said delay control signal is at one level and the sum of said delay time generated by said signal-delaying means and the delay time generated by said first and third clocked inverters is selected to be output by said delay circuit if the phase of said delay control signal is at another level.

12. A delay circuit according to claim 8, further comprising first and second signal-delaying means, connected to the input terminal of said first clocked inverter and the output terminal of said second inverter, respectively, wherein the sum of a delay time generated by said first and second signal-delaying means is selected to be output by said delay circuit if the phase of said delay control signal is at one level and the sum of said delay time generated by said first and second signal-delaying means and the delay time generated by said first and third clocked inverters is selected to be output by said delay circuit if the phase of said delay control signal is at another level.

* * * * *